US009934838B1

(12) United States Patent
Han et al.

(10) Patent No.: US 9,934,838 B1
(45) Date of Patent: Apr. 3, 2018

(54) PULSE SHAPING UNIT CELL AND ARRAY FOR SYMMETRIC UPDATING

(71) Applicant: INTERNATIONAL BUSINESS MACHINES CORPORATION, Armonk, NY (US)

(72) Inventors: Jin-Ping Han, Yorktown Heights, NY (US); Xiao Sun, Yorktown Heights, NY (US); Teng Yang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/591,834

(22) Filed: May 10, 2017

(51) Int. Cl.
*G11C 11/22* (2006.01)
*G11C 13/00* (2006.01)
*G06N 3/04* (2006.01)
*G06N 3/08* (2006.01)

(52) U.S. Cl.
CPC ............ *G11C 11/2273* (2013.01); *G06N 3/04* (2013.01); *G06N 3/084* (2013.01); *G11C 13/004* (2013.01); *G11C 2013/0052* (2013.01)

(58) Field of Classification Search
CPC ............ G11C 11/2273; G11C 13/004; G11C 2013/0052; G06N 3/04; G06N 3/084
USPC .......... 365/145, 51, 63, 102, 117, 129, 149, 365/189.011, 233.1, 233.11, 233.12
See application file for complete search history.

(56) References Cited

U.S. PATENT DOCUMENTS

| 5,583,402 | A | 12/1996 | Moisin et al. |
| 8,712,940 | B2 | 4/2014 | Modha |
| 9,466,362 | B2 | 10/2016 | Yu et al. |
| 9,697,881 | B2 * | 7/2017 | Nicholes ................ G11C 14/00 |
| 2011/0170330 | A1 * | 7/2011 | Oezyilmaz ............ B82Y 10/00 365/145 |
| 2015/0170025 | A1 | 6/2015 | Wu et al. |
| 2016/0042271 | A1 | 2/2016 | Yoon et al. |
| 2016/0276014 | A1 * | 9/2016 | Fox ....................... G11C 11/221 |

OTHER PUBLICATIONS

Gokmen, et al., "Acceleration of Deep Neural Network Training with Resistive Cross-Point Devices: Design Considerations", Frontiers in Neuroscience, Jul. 2016, pp. 1-13, vol. 10.
Sheikholeslami,, et al., "A Survey of Circuit Innovations in Ferroelectric Random-Access Memories", Proceedings of the the IEEE, May 2000, pp. 667-689, vol. 88, No. 5.
Miller et al., "Modeling Ferroelectric Capacitor Switching with Asymmetric Nonperiodic Input Signals and Arbitrary Initial Condictions", J. Appl Phys., Sep. 1991, pp. 2849-2860.

* cited by examiner

*Primary Examiner* — Fernando Hidalgo
(74) *Attorney, Agent, or Firm* — Tutunjian & Bitetto, P.C.; Vazken Alexanian

(57) ABSTRACT

A memory unit cell and memory array device are provided. The memory unit cell includes a pulse adjustment circuit for providing an adjusted pulse with symmetric weight updating for a given state update in response to an input pulse and state feedback. The memory unit further includes a synapse element having a memory element with hysteresis for storing one of multiple possible states responsive to the adjusted pulse and for providing the state feedback to the pulse adjustment circuit.

25 Claims, 19 Drawing Sheets

| Input signals (LV1) | | | Intermediate signals (LV2) | | action |
|---|---|---|---|---|---|
| $x_{ui}$ | $y_{uj}$ | $x_{ri}$ $y_{rj}$ | EN | +/- | |
| 0 | 0 | $V_{in}$ $V_{cm}$ | 0 | - | read-out: Forward |
| 0 | 0 | $V_{cm}$ $V_{in}$ | 0 | - | read-out: Backward |
| 1 | 1 | 1 1 | 1 | 1 | Update + |
| 1 | 0 | 0 0 | 1 | 0 | Update - |
| 0 | 1 | - - | 0 | - | Hold, NA |
| 0 | 0 | - - | 0 | - | Hold, NA |
| 0 | 0 | - - | 0 | - | Hold, NA |

PULSE SHAPING UNIT CELL AND ARRAY FOR SYMMETRIC UPDATING

BACKGROUND

Technical Field

The present invention relates generally to information processing and, in particular, to a pulse shaping unit cell and array for symmetric updating.

Description of the Related Art

Neural network based computation paradigms are starting to make a significant business impact on cognitive computing such as pattern/speech recognition, and especially in the area of software. However, training such neural networks is very slow and complicated, and lacks online learning.

A hardware/device implementation for neural networks (e.g., Deep Neural Networks (DNNs), Convolutional Neural Networks (CNNs), and Recurrent Neural Networks (RNNs)), involving the use of a Resistive Processing Unit (RPU), has been proposed to speed up the computation, improve the error rate, and enable online learning. While symmetric updating is very critical for neuromorphic computation in order to maintain a low error rate, currently applied materials and technologies (ferroelectric materials, Phase Change Memory (PCM), and Resistive Random Access Memory (RRAM)) have not been able to provide an ideal solution for the symmetric updating.

SUMMARY

According to an aspect of the present invention, a memory unit cell is provided. The memory unit cell includes a pulse adjustment circuit for providing an adjusted pulse with symmetric weight updating for a given state update in response to an input pulse and state feedback. The memory unit further includes a synapse element having a memory element with hysteresis for storing one of multiple possible states responsive to the adjusted pulse and for providing the state feedback to the pulse adjustment circuit.

According to another aspect of the present invention, a memory array device is provided. The memory array device includes a plurality of memory unit cells. Each of the plurality of memory unit cells includes a pulse adjustment circuit for providing an adjusted pulse with symmetric weight updating for a given state update in response to an input pulse and state feedback. Each of the plurality of memory unit cells further includes a synapse element having a memory element with hysteresis for storing one of multiple possible states responsive to the adjusted pulse and for providing the state feedback to the pulse adjustment circuit.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 4 shows a table relating to input signals, output signals, and actions corresponding to the memory unit cell 300 of FIG. 3, in accordance with an embodiment of the present invention;

DETAILED DESCRIPTION

The present invention is directed to a pulse shaping unit cell and array for symmetric updating.

The present invention is based on the observation that while ferroelectric (e.g., $HfO_2$ based) materials have been promising as a device material for a Resistive Processing Unit (RPU), the symmetric issue is profound and unlikely to be overcome solely through materials optimization.

Accordingly, the present invention provides pulse adjustment circuits to amend the ferroelectric device or equivalent circuit unit cell in order to achieve symmetric updating with sufficient dynamic range (or number of states) with a limited number of transistors. Hence, the present invention leads to small area overhead and enables the building of a large array. Moreover, the present invention is particularly suitable for non-ideal memory devices (including, but not limited to resistive cross point structures, RPUs, and so forth) and is capable of addressing the asymmetric updating issue of such memory devices.

The present invention also provides array integration and operation. In particular, in an embodiment, the present invention provides a methodology for reusing read lines at the updating phase to further reduce the connectivity complexity.

In an embodiment, the developed unit cell includes: (i) a pseudo emerging device; (ii) a pulse adjustment circuit; and (iii) an enable control circuit.

In an embodiment, the pulse adjustment circuit can adjust pulse width with local feedback. In an embodiment, the pulse adjustment circuit can be designed for a Complimentary Metal-Oxide Semiconductor (CMOS) equivalent circuit, and is also capable of being implemented on ferroelectric, or any other emerging memory devices (RRAM, PCM, and so forth) after minimal modification, in both Front End Of Line (FEOL) or Back End Of Line (BEOL) applications, as readily appreciated by one of ordinary skill in the art given the teachings of the present invention provided herein, while maintaining the spirit of the present invention.

In an embodiment, the array integration allows for the reuse of read lines for update and array operations to be extended to large array sizes. In an embodiment, the same block array peripherals (integrator and drivers) can be configured to perform different functions at different modes (Read-out, Update). In an embodiment, the array integration allows for decomposition updating adapting to the involved/used hardware.

Figure 1:
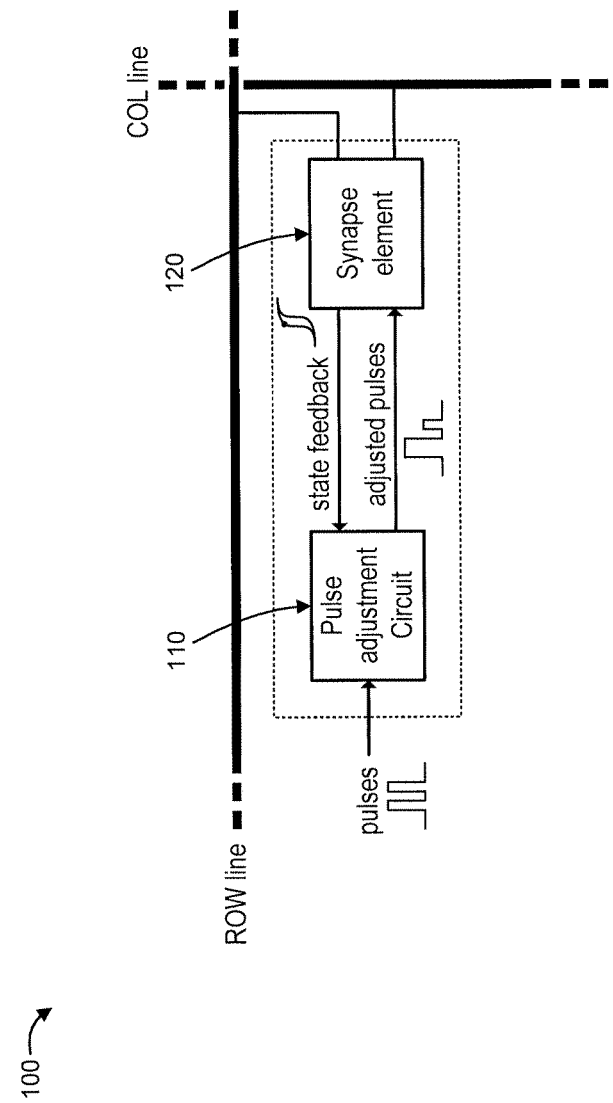
FIG. 1 shows an exemplary memory unit cell, in accordance with an embodiment of the present invention.

FIG. 1 shows an exemplary memory unit cell 100, in accordance with an embodiment of the present invention.

The memory unit cell 100 includes a pulse adjustment circuit 110, and a synapse element 120. The pulse adjustment circuit 110 and the synapse element 120 are interconnected. The synapse element 120 is connected to a ROW line 101 and to a COLUMN 102 line of a memory device in which the memory unit cell 100 is included.

The pulse adjustment circuit 110 receives pulses, adjusted the pulses, and outputs adjusted pulses. The pulses can be adjusted based on state feedback from the synapse element 120. Thus, the pulse adjustment circuit 100 includes two inputs, one for the pulses to be updated and the other one of the state feedback. The adjusted output pulses can be shape-adjusted pulses having a modulated pulse width and/or a modulated pulse magnitude, with symmetric weight updating.

The synapse element 120 can be a memory element with hysteresis that is able to store multiple states. The synapse element 120 can be implemented by, for example, but not limited to, a model (e.g., a Verilog A model, and so forth), a CMOS circuit, a ferroelectric field effect transistor (FeFET), and so forth). Of course, the synapse element 120 is not limited to only the preceding limitations and, thus, can be applied to other emerging memory devices, as readily appreciated by one of ordinary skill in the art given the teachings of the present invention provided herein, while maintaining the spirit of the present invention.

Figure 2:
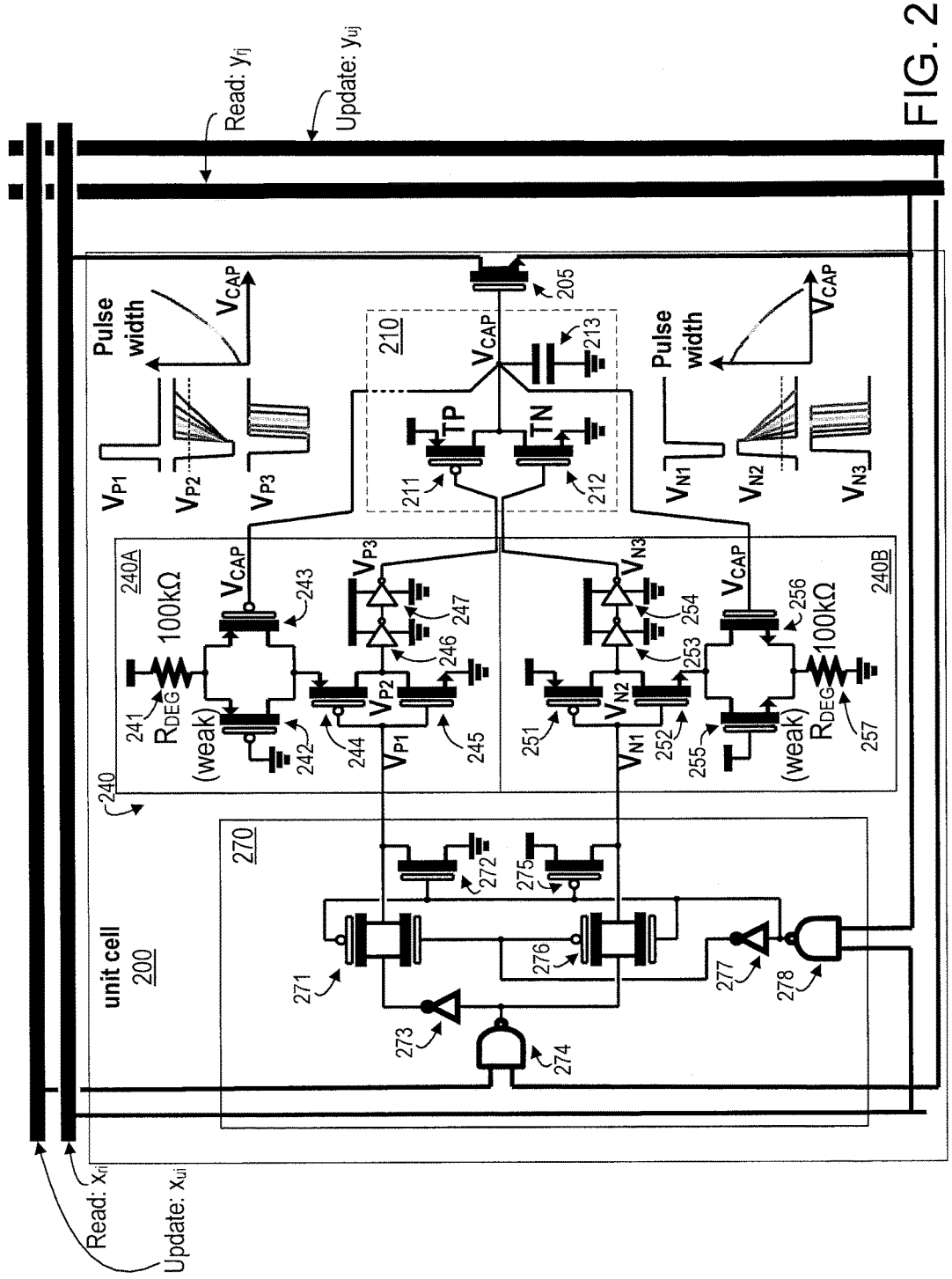
FIG. 2 shows an exemplary memory unit cell circuit, in accordance with an embodiment of the present invention.

FIG. 2 shows an exemplary memory unit cell circuit 200, in accordance with an embodiment of the present invention.

The memory unit cell circuit 200 includes a ferroelectric equivalent circuit 210, a pulse width adjustment circuit (PWADJ) 240, and an enable circuit 270. The pulse width adjustment circuit (PWADJ) 240 includes a pulse width+ adjustment circuit (PW adj. (+)) 240A and a pulse width− adjustment circuit (PW adj. (−)) 240B.

The memory unit cell circuit 200 further includes an N-channel MOSFET 205.

The memory unit cell circuit 200 is connected to an update $(x_{ui})$ row, a read $(x_{ri})$ row, an update $(y_{uj})$ column, and a ready $(y_{rj})$ column.

The ferroelectric equivalent circuit 210 includes a P-channel Metal Oxide Semiconductor Field Effect Transistor (MOSFET) TP 211, an N-channel MOSFET TN 212, and a capacitor 213.

The pulse width adjustment circuit (PWADJ) 240 includes a resistor 241, a P-channel MOSFET 242, a P-channel MOSFET 243, a P-channel MOSFET 244, an N-channel MOSFET 245, a buffer 246, a buffer 247, a P-channel MOSFET 251, an N-channel MOSFET 252, a buffer 253, a buffer 254, an N-channel MOSFET 255, an N-channel MOSFET 256, and a resistor 257.

The enable circuit 270 includes a memory element 271, a N-channel MOSFET 272, a buffer 273, a NAND gate 274, a P-channel MOSFET 275, a memory cell 276, a buffer 277, and a NAND gate 278.

The MOSFETs in FIG. 2 are enhancement mode MOSFETs. However, equivalent circuitry can be used, while maintaining the spirit of the present invention.

In FIG. 2, various exemplary voltages used by the memory unit cell circuit 200 are shown, including $V_{P1}$, $V_{P2}$, $V_{R3}$, $V_{N1}$, $V_{N2}$, and $V_{N3}$. Of course, in other embodiments, these voltages can vary, while maintaining the spirit of the present invention.

In an embodiment, the following specifications can apply to the memory unit cell circuit 200:
VCAP range: [0.5,2.0];
Updating step size (ΔVCAP): 7 mV;
Available number of states: 214; and
Updating error per step: <0.3 mV.
Of course, other values can be used, while maintaining the spirit of the present invention.

In an embodiment, the present invention can be used for a backpropagation method that includes three cycles, namely a forward cycle, a backward cycle, and a weight update cycle (herein "weight update" in short).

Figure 3:
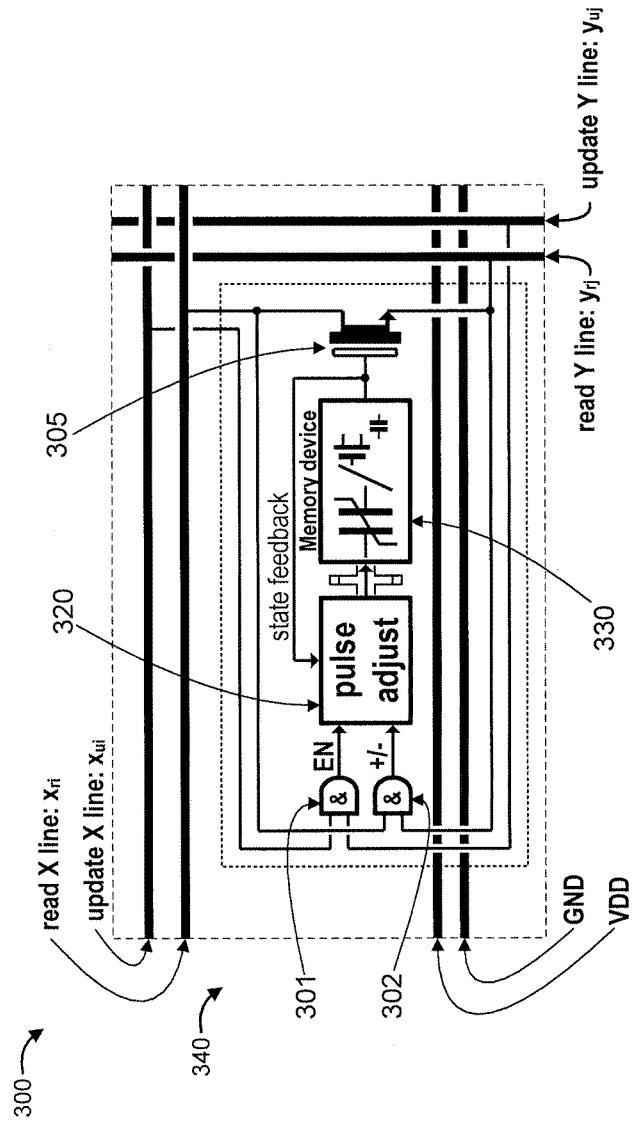
FIG. 3 shows exemplary functioning of a memory unit cell regarding an array operation, in accordance with an embodiment of the present invention.

FIG. 3 shows exemplary functioning of a memory unit cell 300 regarding an array operation, in accordance with an embodiment of the present invention.

The memory unit cell circuit 300 includes an AND gate 301, an AND gate 302, a pulse width adjustment circuit (PWADJ) 320, and a memory device 330. The AND gates 301 and 302 represent an enable circuit 340.

The memory unit cell circuit 300 further includes an N-channel MOSFET 305.

The memory unit cell circuit 300 is connected to an update X line $(x_{ui})$ row, a read X line $(x_{ri})$ row, an update Y line $(y_{uj})$ column, and a ready Y line $(y_{rj})$ column.

The memory unit cell circuit 300 has at least the following two working modes: (i) a read-out mode; and (ii) an update mode.

The memory unit cell circuit 300 has two pair of X-Ys: (i) read lines X,Y; and (ii) update lines X,Y.

The update lines coincidence→valid pulse,
where EN=$x_u$ & $y_u$.

In the example of FIG. 3, the read lines are re-used as +/− indicator as follows: (i)+/− is determined by states of read lines $x_r$ and $y_r$; and (ii) no current flows through the device ($x_r$ and $y_r$ are both 1 or both 0).

The memory unit cell circuit 300 supports a parallel stochastic update. In the parallel stochastic update, a decomposition x*δ can be performed as follows:

$$x \to x^+ + x^-;\ \delta \to \delta^+ + \delta^-$$

Step 1,2(Yr=Xr=1): $\delta^+ x^+;\ \delta^- x^-$

Step 3,4(Yr=Xr=0): $\delta^+ x^-;\ \delta^- x^+$ $$\delta \cdot x = \delta^+ x^+ + \delta^- x^- + \delta^+ x^- + \delta^- x^+$$

where x represents the activity at an input neuron and δ represents the error computed by an output neuron.

It is to be appreciated that there are no disturbances between the read and update operations.

The memory device 330 can be implemented using any of the following: one or more two terminal devices; and one or more three terminal devices. The particular type of device(s) used can depend upon the implementation. These and other variations of memory unit cell circuit 300 are readily determined by one of ordinary skill in the art given the teachings of the present invention provided herein, while maintaining the spirit of the present invention.

FIG. 4 shows a table 400 relating to input signals, output signals, and actions corresponding to the memory unit cell 300 of FIG. 3, in accordance with an embodiment of the present invention.

Figure 5:
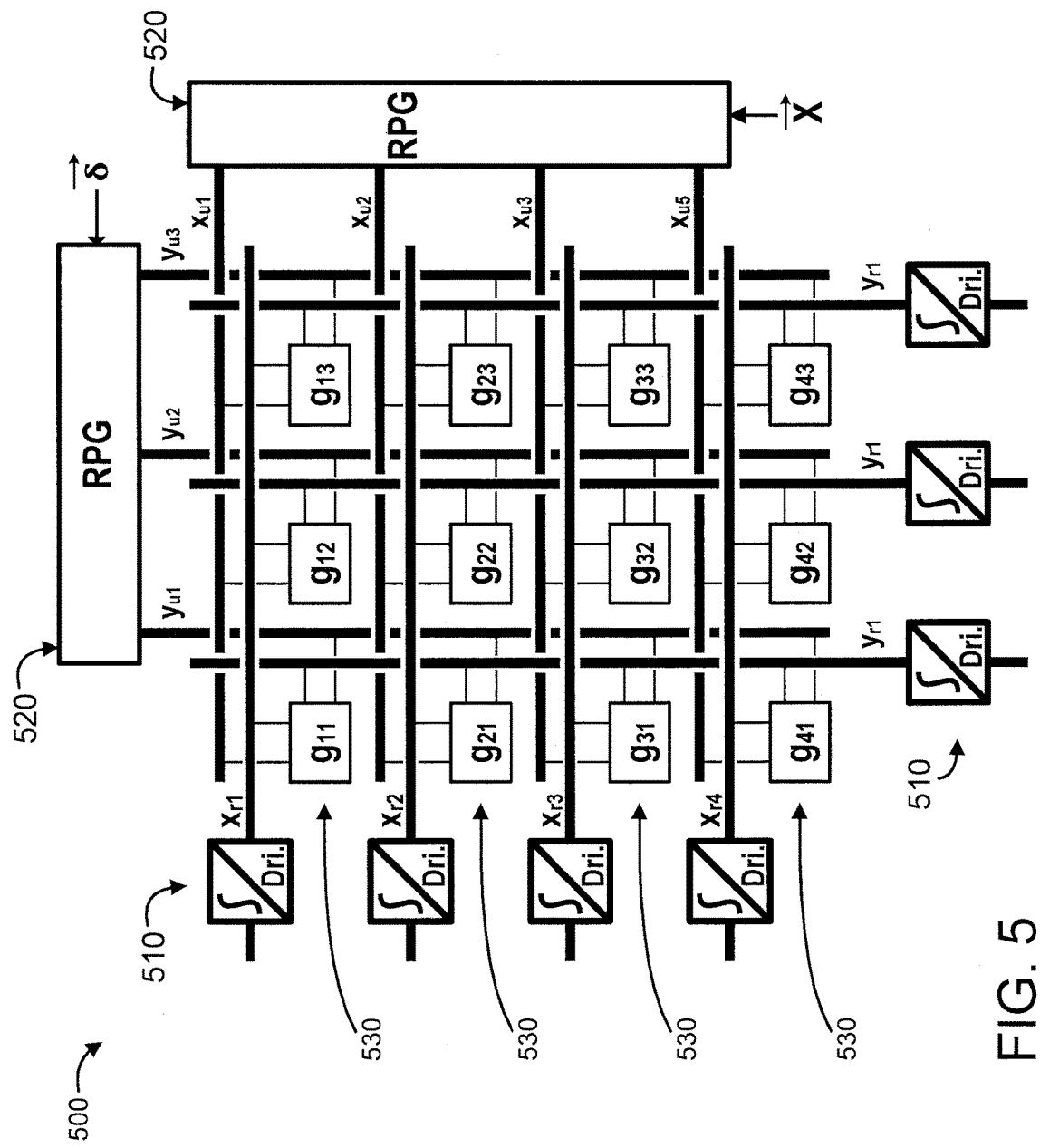
FIG. 5 shows an exemplary memory array structure, in accordance with an embodiment of the present invention.

FIG. 5 shows an exemplary memory array structure 500, in accordance with an embodiment of the present invention.

The array structure 500 includes a set of ReConfigurable Integrator and Drivers (RCIDs) 510, a set of Random Pulse Generators (RPGs) 520, and a set of memory cells 530.

The set of RCIDs 510 connect to $x_{ri}$ and $y_{rj}$.

The RPGs 520 connect to $x_{ui}$, and $y_{uj}$.

In a read-out mode, the set of RCIDs 510 are involved to input density modulated pulses and output integrated voltages.

In an update mode, the set of RCIDs 510 and the set of RPGs 520 perform a stochastic update mode, in parallel, using 2 vectors (δ, X).

Figure 6:
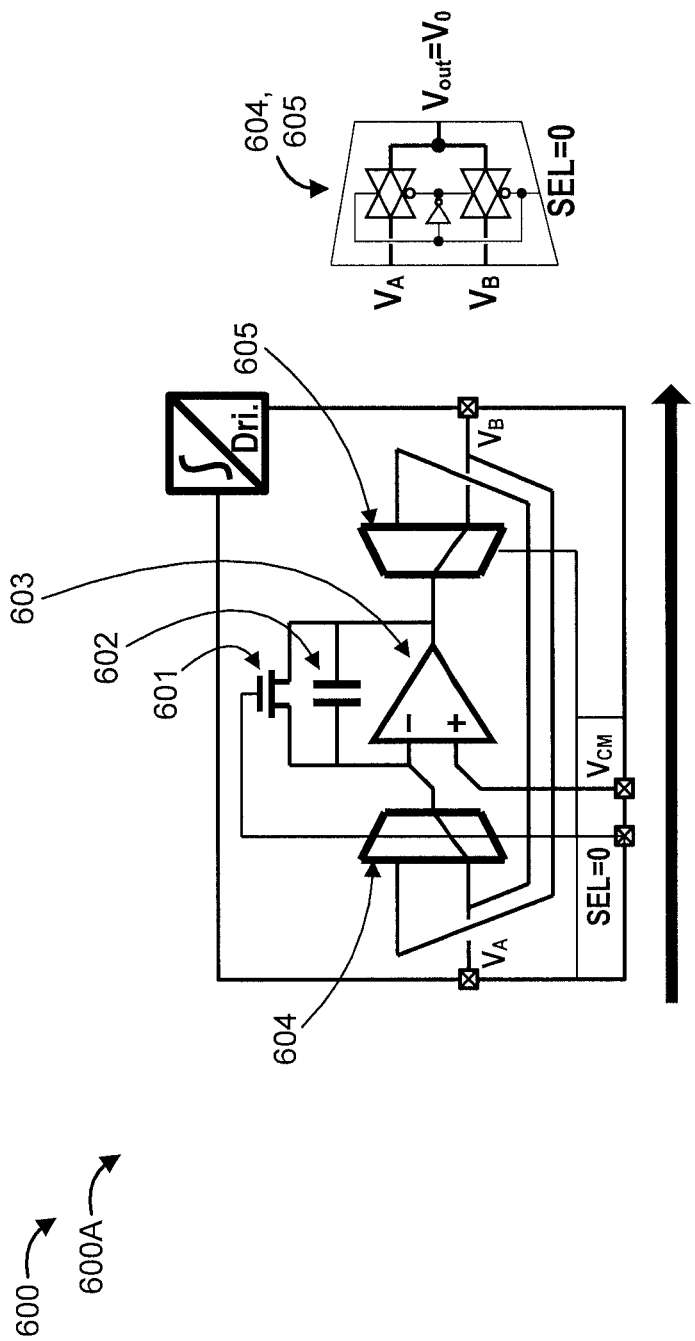
FIG. 6 shows an exemplary RCID, configured as an integrator, in accordance with an embodiment of the present invention.
Figure 7:
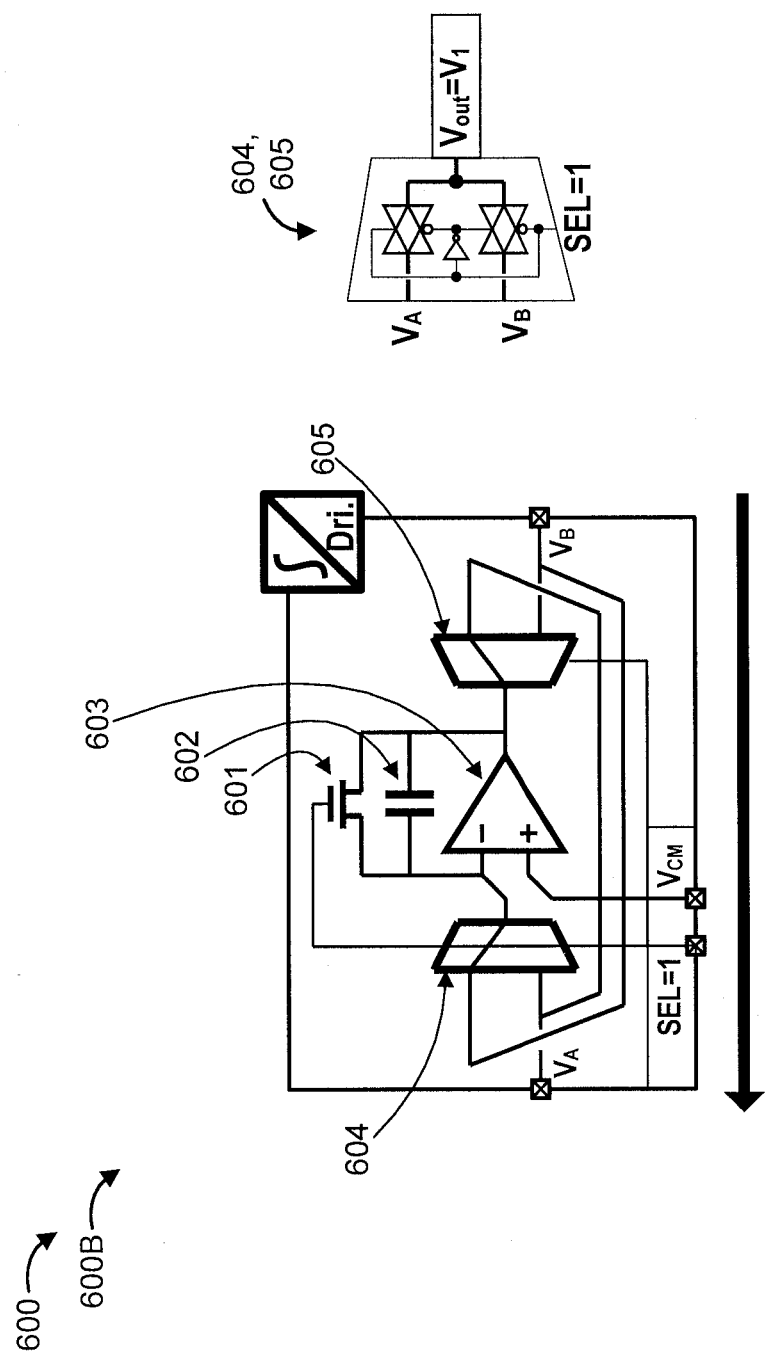
FIG. 7 shows the exemplary RCID of FIG. 6, configured as a line driver, in accordance with an embodiment of the present invention.

FIG. 6 shows an exemplary RCID 600, configured as an integrator 600A, in accordance with an embodiment of the present invention. FIG. 7 shows the exemplary RCID 600 of FIG. 6, configured as a line driver 600B, in accordance with an embodiment of the present invention. For the integrator 600A, the SEL input is equal to 0, and $V_B = \int I_a dt$. For the line driver 600B, the SEL input is equal to 1, and $V_A = V_B$.

The RCID 600 includes MOSFET 601, a capacitor 602, an operational amplifier (op-amp) 603, a multiplexer 604, and a multiplexer 605.

Different pathways are enabled in the multiplexers 604 and 605 based on the value of the SEL input, as shown on the right in FIGS. 6 and 7.

Figure 8:
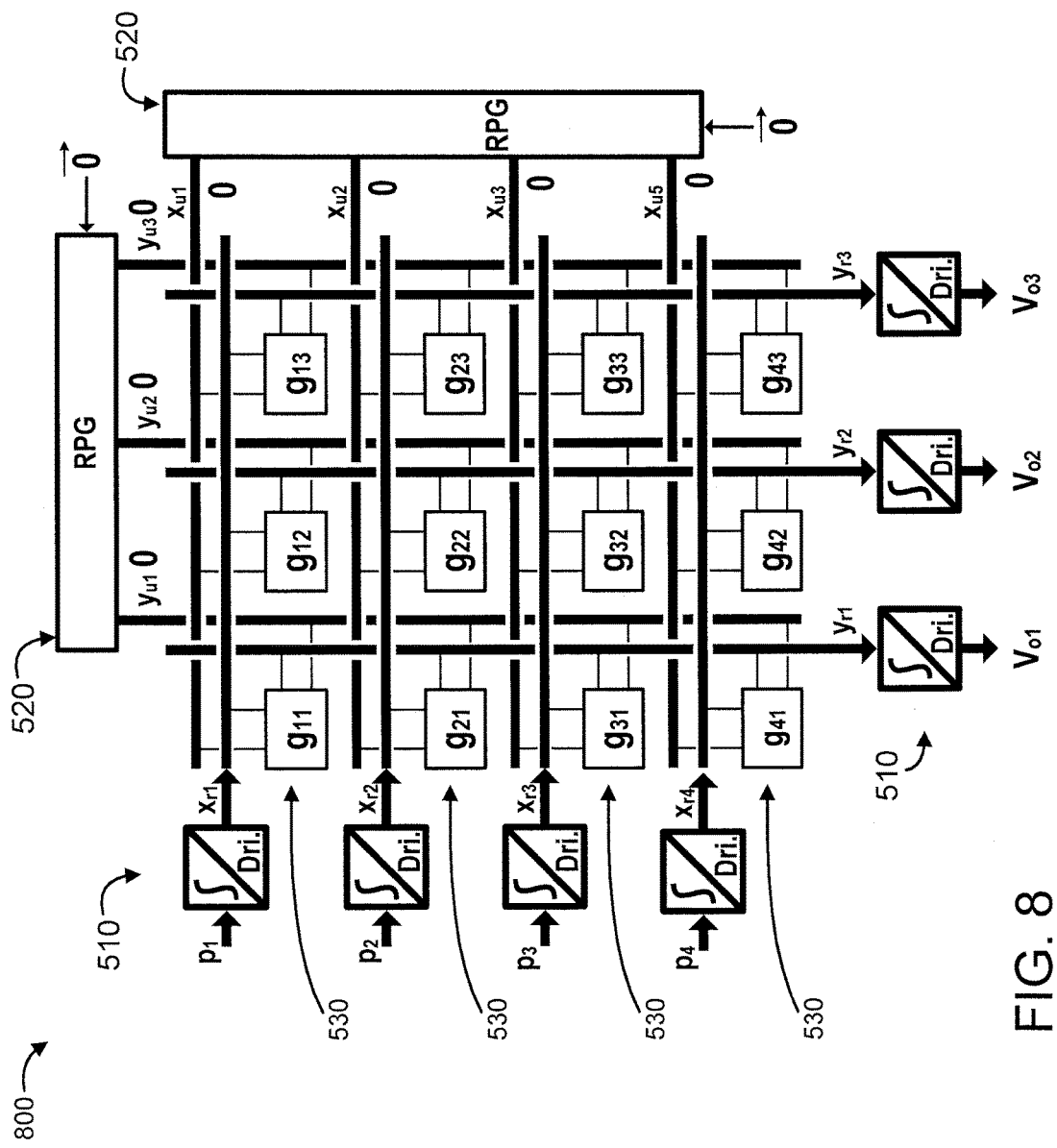
FIG. 8 shows a forward (read out) array operation on the memory array structure of FIG. 5, in accordance with an embodiment of the present invention.

FIG. 8 shows a forward (read out) array operation 800 on the memory array structure 500 of FIG. 5, in accordance with an embodiment of the present invention. In FIG. 8, the RCIDs 520 connected to $x_r$'s are in "driving mode", while the RCIDs 520 connected to $y_r$'s are in an "integration mode".

The input representation can take on 3 states in voltage as follows:
+1: $V_{VCM} + V_P$
0: VCM
−1: $V_{CM} - V_P$ Hence, the current of cell (i,j) is as follows:
+1: $+g_{i,j} \cdot V_p$
0: 0
−1: $-g_{i,j} \cdot V_p$ The pulse density in the integration window (T) corresponds to the amplitude of the input as follows:

$$V_{oj} = V_p \sum_{i=1}^{4} g_{ij} p_i dt = V_p \sum_{i=1}^{4} (N_{pi} - N_{ni} - N_{ni}) g_{ij}$$

where $N_{pi}$ is the number of +1 in $p_i$ in [0,T], and $N_{ni}$ is number of −1 in $p_i$ in [0,T].

Figure 9:
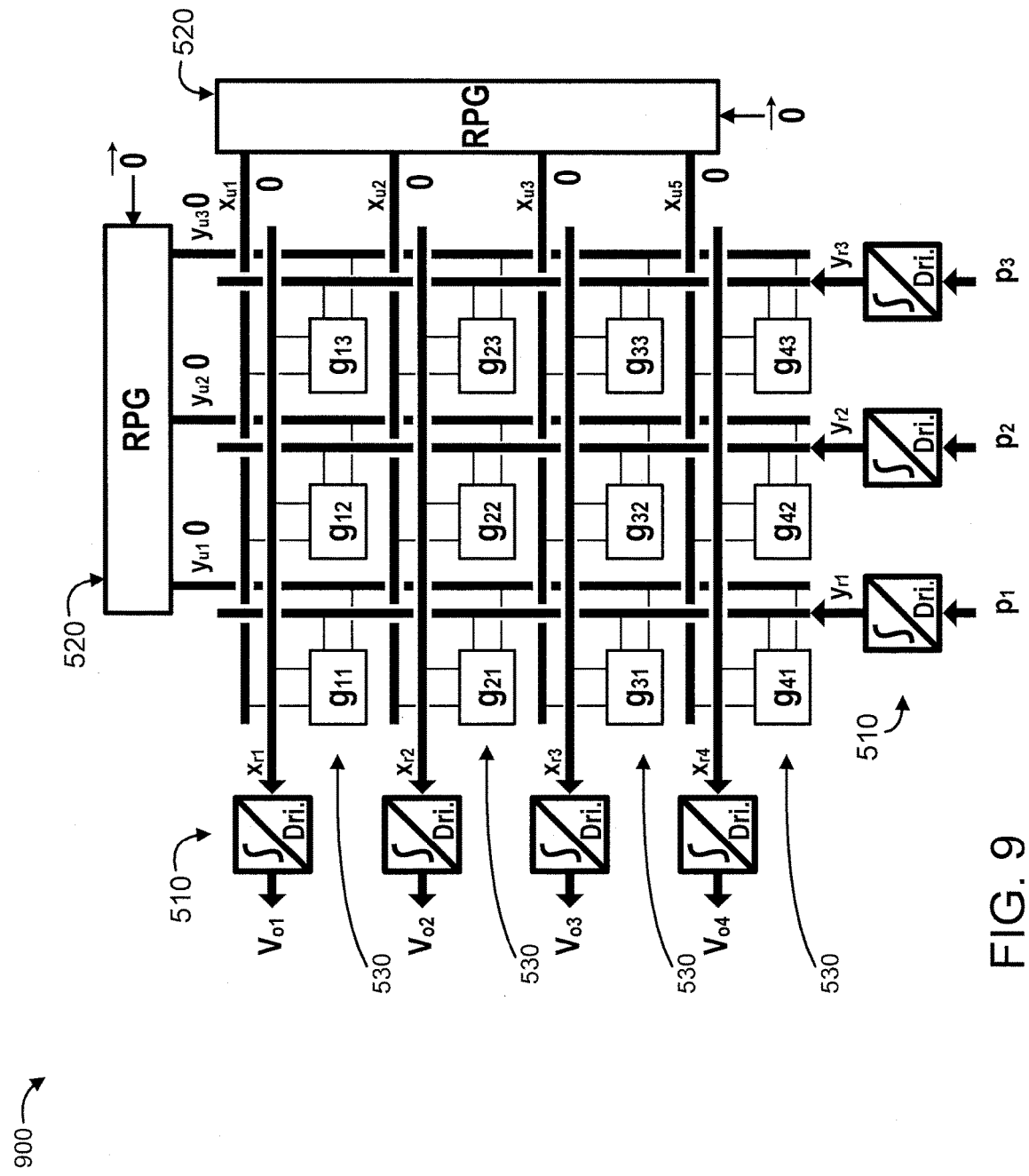
FIG. 9 shows a backward (read out) array operation on the memory array structure of FIG. 5, in accordance with an embodiment of the present invention.

FIG. 9 shows a backward (read out) array operation 900 on the memory array structure 500 of FIG. 5, in accordance with an embodiment of the present invention. In FIG. 9, the RCIDs 520 connected to $y_r$'s are in "driving mode", while the RCIDs 520 connected to $x_r$'s are in an "integration mode".

Figure 10:
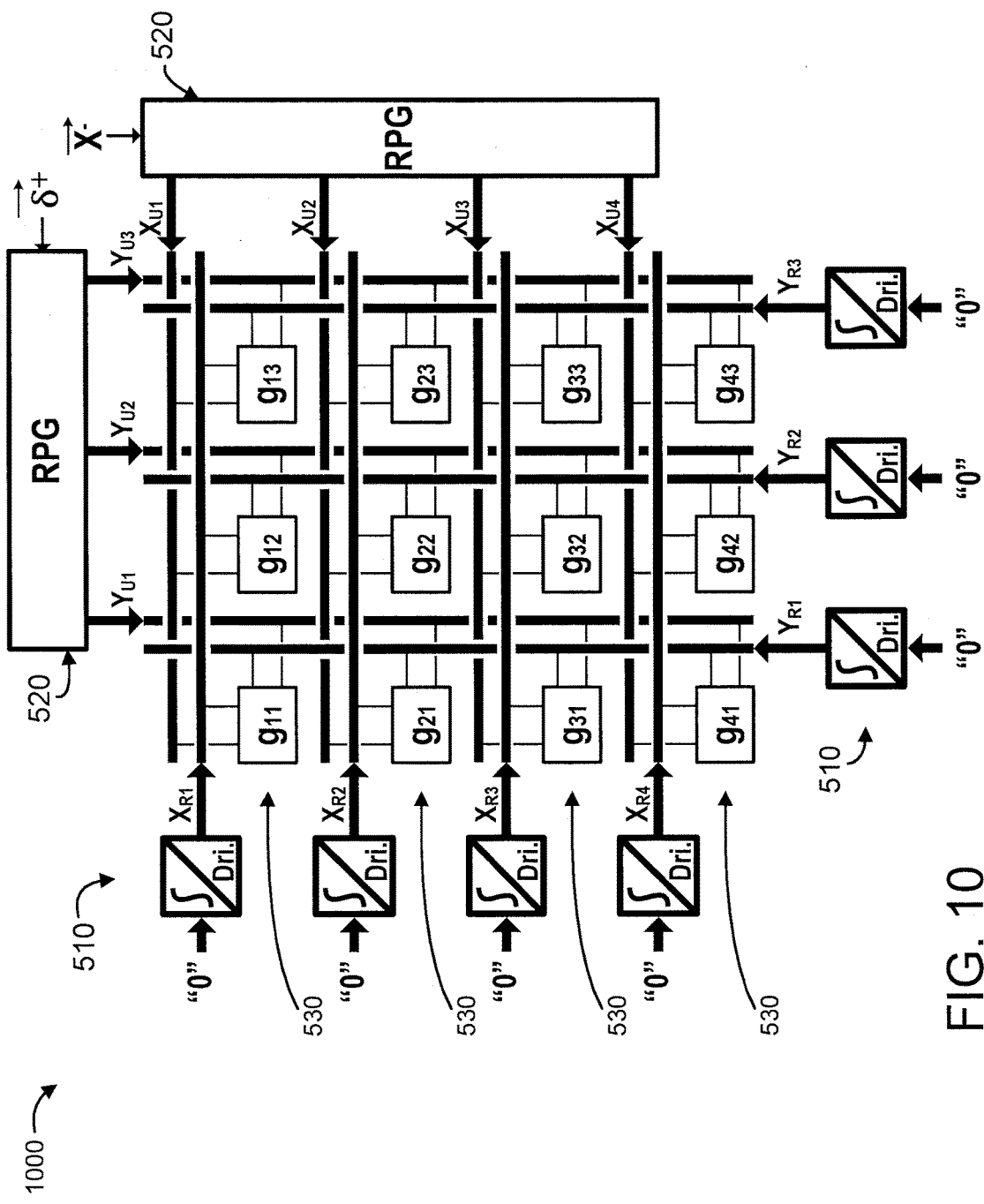
FIG. 10 shows an update (++) array operation on the memory array structure of FIG. 5, in accordance with an embodiment of the present invention.

FIG. 10 shows an update (++) array operation 1000 on the memory array structure 500 of FIG. 5, in accordance with an embodiment of the present invention. In FIG. 10, the RCIDs 520 connected to $x_r$'s are in "driving mode", and the RCIDs 520 connected to $y_r$'s are also in "driving mode". In the update (++) array operation 1000, 1's are provided to the SCDs connected to $x_{ri}$ and to the SCDs connected to $y_{rj}$.

Figure 11:
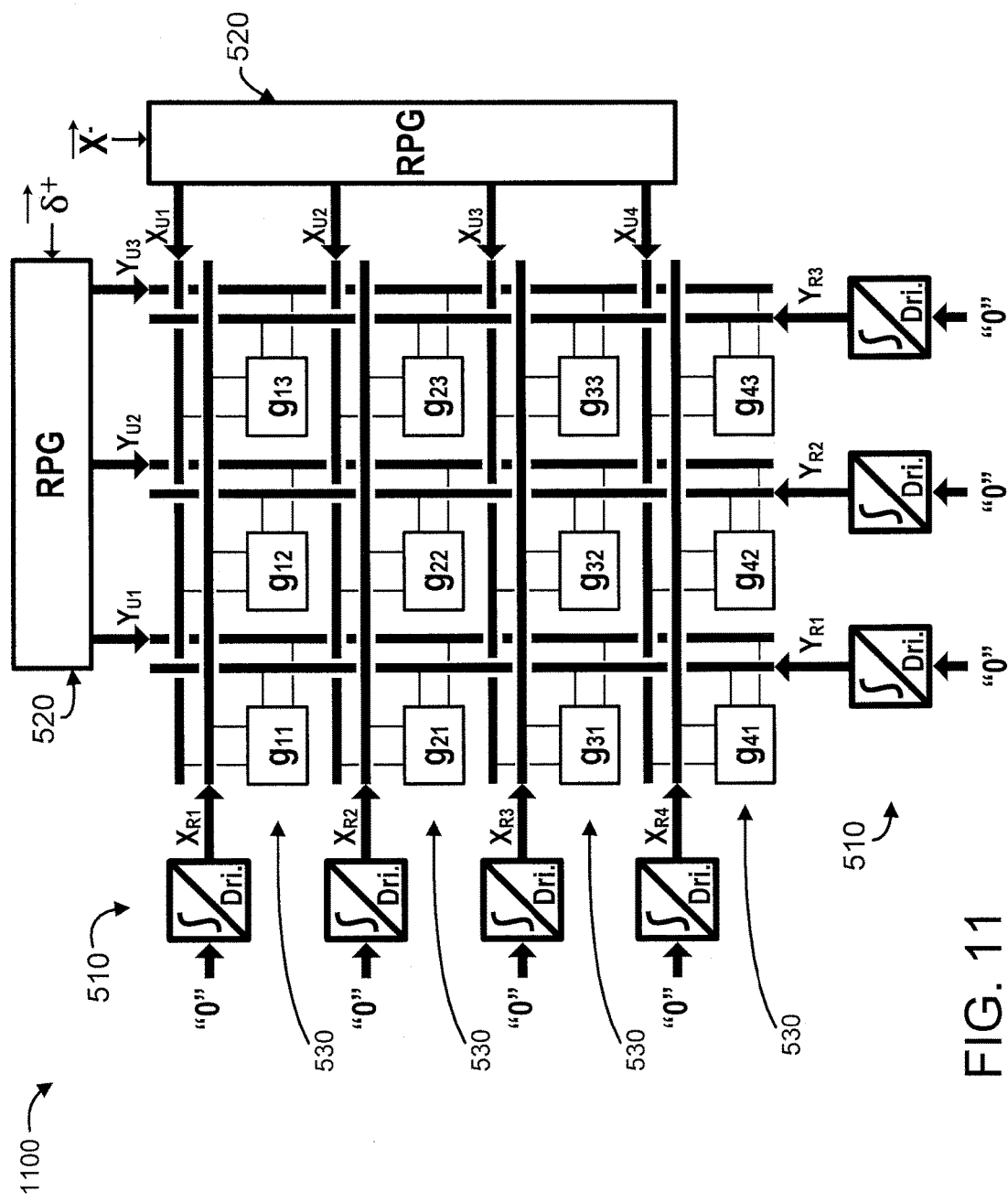
FIG. 11 shows an update (+−) array operation on the memory array structure of FIG. 5, in accordance with an embodiment of the present invention.

FIG. 11 shows an update (+−) array operation 1100 on the memory array structure 500 of FIG. 5, in accordance with an embodiment of the present invention. In FIG. 10, the RCIDs 520 connected to $x_r$'s are in "driving mode", and the RCIDs 520 connected to $y_r$'s are also in "driving mode". In the update (+−) array operation 1000, 1's are provided to the SCDs connected to $x_{ri}$, while 0's are provided to the SCDs connected to $y_{rj}$.

Figure 12:
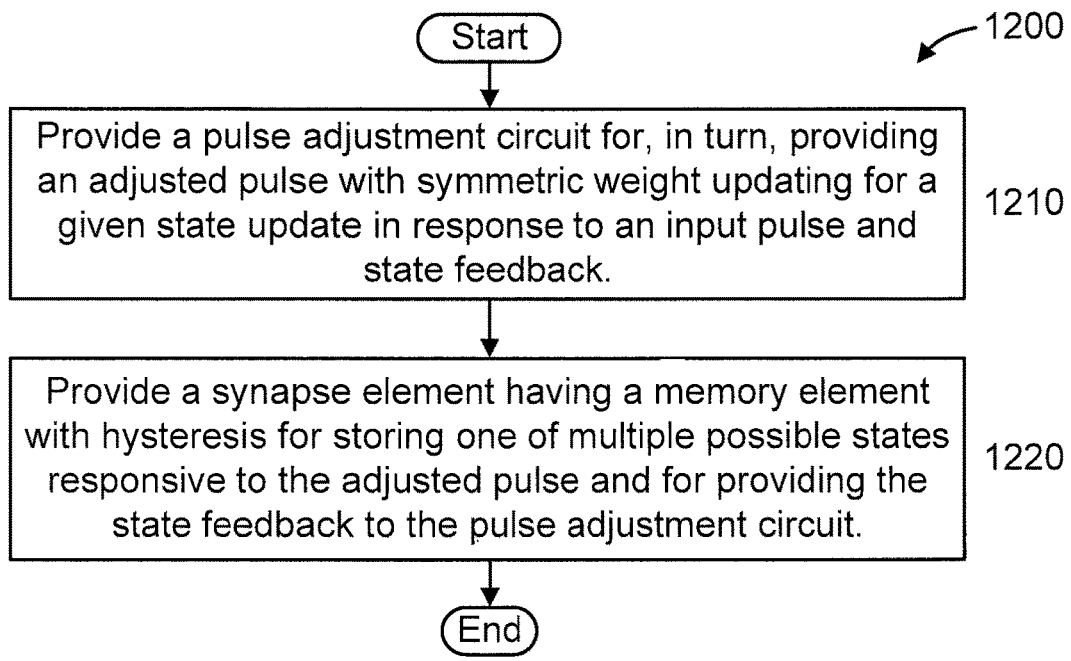
FIG. 12 shows an exemplary method for forming a memory unit cell, in accordance with an embodiment of the present invention.

FIG. 12 shows an exemplary method 1200 for forming a memory unit cell, in accordance with an embodiment of the present invention.

At step 1210, provide a pulse adjustment circuit for, in turn, providing an adjusted pulse with symmetric weight updating for a given state update in response to an input pulse and state feedback.

At step 1220, provide a synapse element having a memory element with hysteresis for storing one of multiple possible states responsive to the adjusted pulse and for providing the state feedback to the pulse adjustment circuit.

In an embodiment, the given state update can be performed for a backpropagation-based non-spiking neural network that is configured to read and update synapse weights along axons and dendrites.

In an embodiment, the state feedback can represent a state of a synapse in a neural network.

In an embodiment, the adjusted pulse can have an adjusted pulse width relative to the input pulse.

Figure 13:
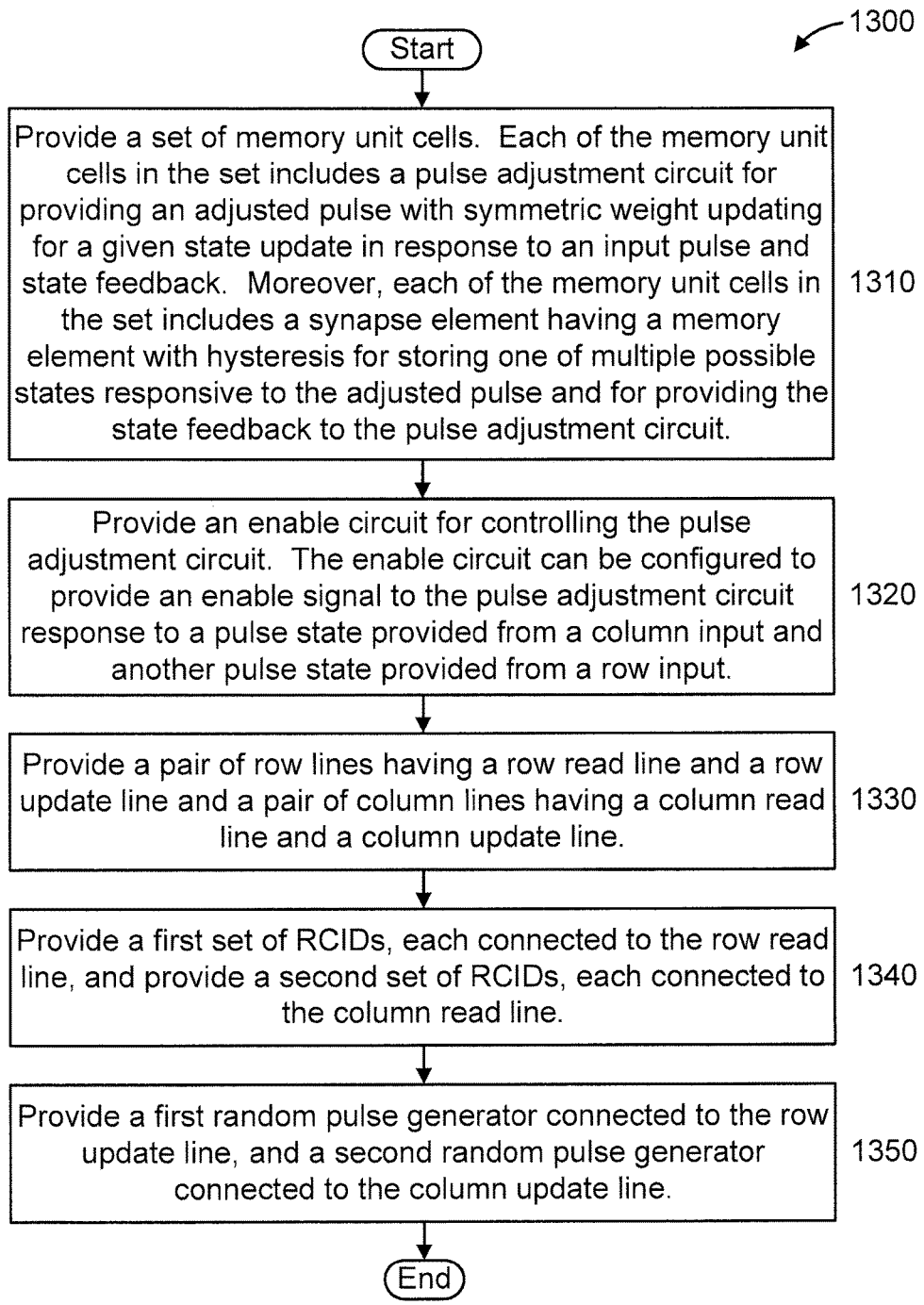
FIG. 13 shows an exemplary method for forming a memory array device, in accordance with an embodiment of the present invention.

FIG. 13 shows an exemplary method 1300 for forming a memory array device, in accordance with an embodiment of the present invention.

At step 1310, provide a set of memory unit cells. Each of the memory unit cells in the set includes a pulse adjustment circuit for providing an adjusted pulse with symmetric weight updating for a given state update in response to an input pulse and state feedback. Moreover, each of the memory unit cells in the set includes a synapse element having a memory element with hysteresis for storing one of multiple possible states responsive to the adjusted pulse and for providing the state feedback to the pulse adjustment circuit.

At step 1320, provide an enable circuit for controlling the pulse adjustment circuit. In an embodiment, the enable circuit can be configured to provide an enable signal to the pulse adjustment circuit response to a pulse state provided from a column input and another pulse state provided from a row input.

At step 1330, provide a pair of row lines having a row read line and a row update line and a pair of column lines having a column read line and a column update line.

At step 1340, provide a first set of RCIDs, each connected to the row read line, and provide a second set of RCIDs, each connected to the column read line.

In an embodiment, the first set and the second set of RCIDs can be configured to perform different functions during different modes of the memory unit cell.

At step 1350, provide a first random pulse generator connected to the row update line, and a second random pulse generator connected to the column update line.

An output of memory array device is based on an integration operation that includes a number of positive pulses and a number of negative pulses applied to the memory array device during an integration window T.

Figure 14:
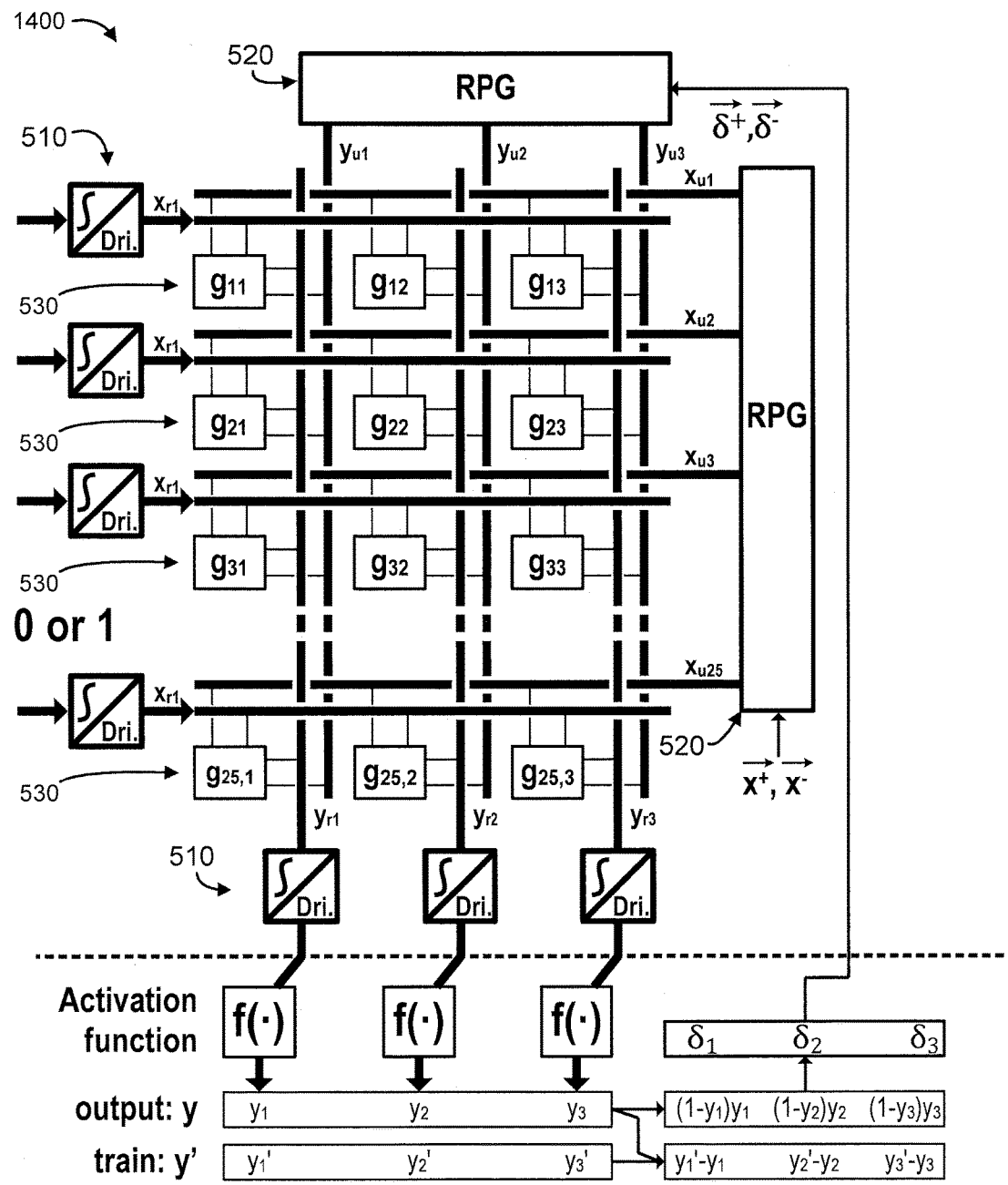
FIG. 14 shows an exemplary mapping performed on the memory array structure of FIG. 5, in accordance with an embodiment of the present invention.

FIG. 14 shows an exemplary mapping (training) 1400 performed on the memory array structure 500 of FIG. 5, in accordance with an embodiment of the present invention. In FIG. 14, f(•) denotes an activation function, y denotes a non-training output, and y' denotes a training output.

Figure 15:
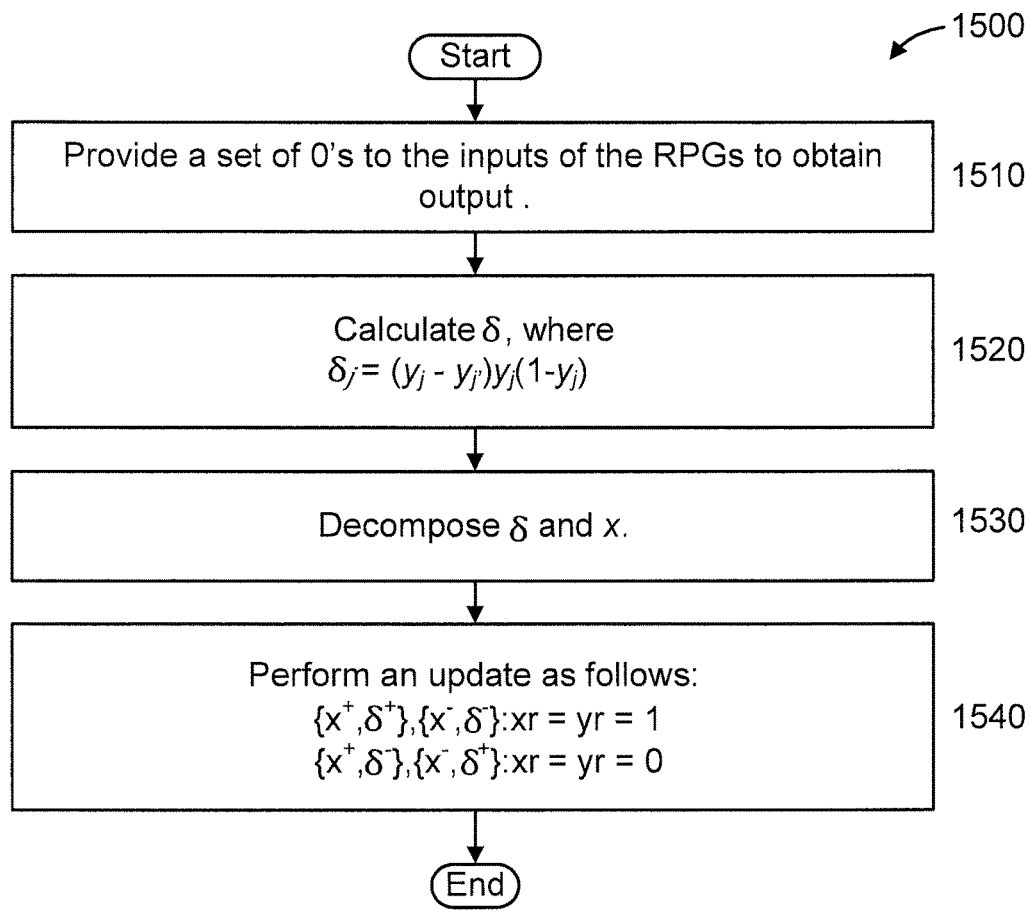
FIG. 15 shows an exemplary method for performing the mapping of FIG. 14, in accordance with an embodiment of the present invention.

FIG. 15 shows an exemplary method 1500 for performing the mapping 1400 of FIG. 14, in accordance with an embodiment of the present invention.

At step 1510, provide a set of 0's to the inputs of the RPGs to obtain output y.

At step 1520, calculate δ, where $$\delta_j = (y_j - y_j')y_j(1-y_j).$$

At step 1530, decompose δ and x.
At step 1540, perform an update as follows:

$$\{x^+, \delta^+\}, \{x^-, \delta^-\} : x_r = y_r = 1$$

$$\{x+, \delta^-\}, \{x^-, \delta^+\} : x_r = y_r = 0.$$

Figure 16:
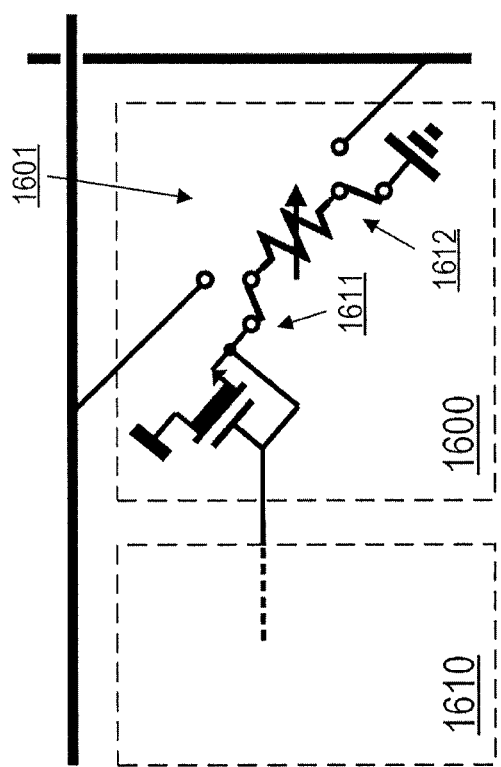
FIG. 16 shows an exemplary two terminal memory device, to which the present invention can be applied, in a first switch position, in accordance with an embodiment of the present invention.
Figure 17:
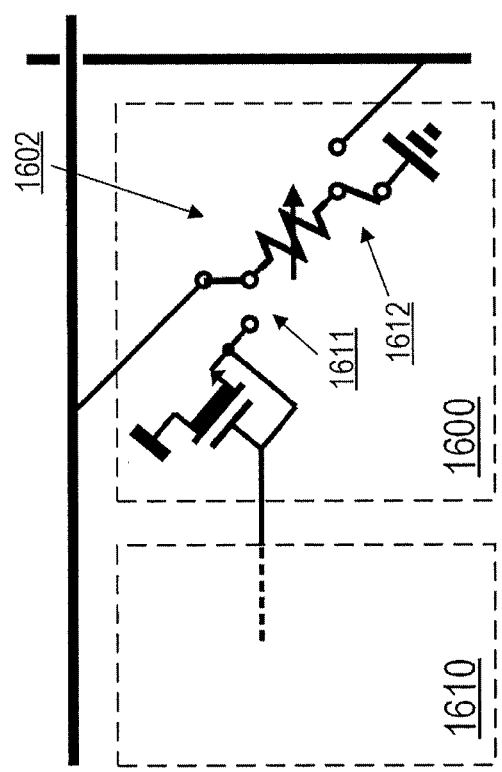
FIG. 17 shows the exemplary two terminal memory device of FIG. 16, to which the present invention can be applied, in a second switch position, in accordance with an embodiment of the present invention.

FIG. 16 shows an exemplary two terminal memory device 1600, to which the present invention can be applied, in a first switch position 1601, in accordance with an embodiment of the present invention. FIG. 17 shows the exemplary two terminal memory device 1600 of FIG. 16, to which the present invention can be applied, in a second switch position 1602, in accordance with an embodiment of the present invention. The two terminal memory device 1600 is connected to a Local Adjustment Periphery (LAP) circuit 1610 that can be used to implement pulse width adjustment/pulse width adjustment circuit 240 of FIG. 2. A simply local current source (zero-$V_{GS}$ native device) to evaluate the state of the memory device 1600 ($g_m$ or r). In order to separate synapse computing and updating, switches 1611 and 1612 are provided.

Figure 18:
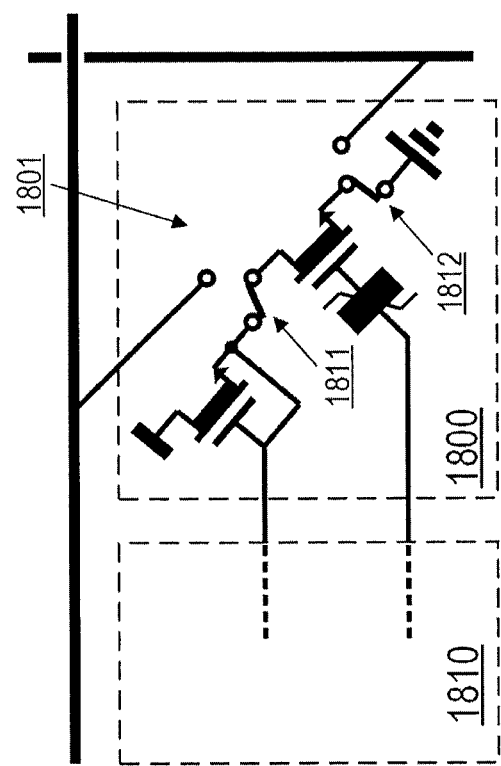
FIG. 18 shows an exemplary three terminal memory device, to which the present invention can be applied, in a first switch position, in accordance with an embodiment of the present invention.
Figure 19:
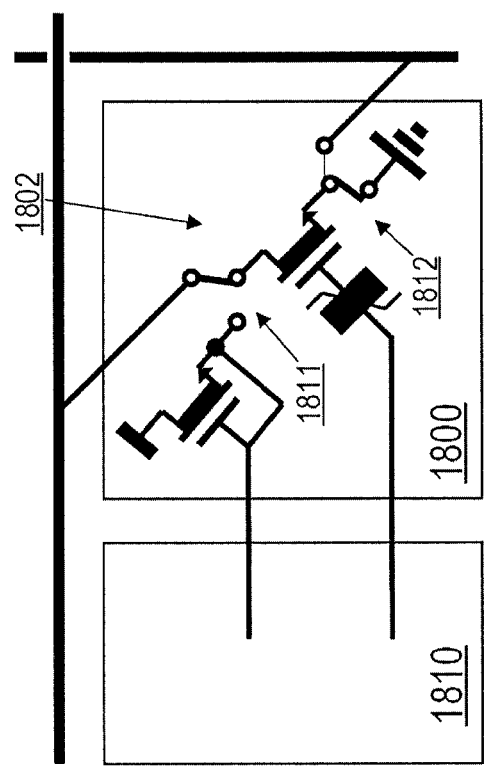
FIG. 19 shows the exemplary three terminal memory device of FIG. 18, to which the present invention can be applied, in a second switch position, in accordance with an embodiment of the present invention.

FIG. 18 shows an exemplary three terminal memory device 1800, to which the present invention can be applied, in a first switch position 1801, in accordance with an embodiment of the present invention. FIG. 19 shows the exemplary three terminal memory device 1800 of FIG. 18, to which the present invention can be applied, in a second switch position 1802, in accordance with an embodiment of the present invention. The two terminal memory device 1800 is connected to a Local Adjustment Periphery (LAP) circuit 1810 that can be used to implement pulse width adjustment/pulse width adjustment circuit 240 of FIG. 2. A simply local current source (zero-$V_{GS}$ native device) to evaluate the state of the memory device 1800 ($g_m$ or r). In order to separate synapse computing and updating, switches 1811 and 1812 are provided.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as SMALLTALK, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A memory unit cell, comprising:
a pulse adjustment circuit for providing an adjusted pulse with symmetric weight updating for a given state update in response to an input pulse and state feedback; and
a synapse element having a memory element with hysteresis for storing one of multiple possible states responsive to the adjusted pulse and for providing the state feedback to the pulse adjustment circuit.

2. The memory unit cell of claim 1, wherein the given state update is comprised in a backpropagation-based non-spiking neural network that is configured to read and update synapse weights along axons and dendrites.

3. The memory unit cell of claim 1, wherein the state feedback represents a state of a synapse in a neural network.

4. The memory unit cell of claim 1, wherein the adjusted pulse has an adjusted pulse width relative to the input pulse.

5. The memory unit cell of claim 1, wherein the memory element with hysteresis comprises a ferroelectric memory device.

6. The memory unit cell of claim 1, wherein the memory element with hysteresis comprises a Complimentary Metal Oxide Semiconductor (CMOS) circuit.

7. The memory unit cell of claim 1, wherein the memory element with hysteresis comprises a Resistive Processing Unit (RPU).

8. The memory unit cell of claim 1, wherein the memory unit cell is configured to selectively operate in a given mode selected from the group consisting of a read out mode and an update mode.

9. The memory unit cell of claim 1, wherein the multiple possible states comprise three different states, with two of the three different states being partially based on an input polarity.

10. A memory array device, comprising:
a plurality of memory unit cells, each comprising:
   a pulse adjustment circuit for providing an adjusted pulse with symmetric weight updating for a given state update in response to an input pulse and state feedback; and
   a synapse element having a memory element with hysteresis for storing one of multiple possible states responsive to the adjusted pulse and for providing the state feedback to the pulse adjustment circuit.

11. The memory array device of claim 10, further comprising a pair of row lines having a row read line and a row update line and a pair of column lines having a column read line and a column update line.

12. The memory array device of claim 1, further comprising:
   a first set of ReConfigurable Integrator and Drivers (RCIDs), each connected to the row read line; and
   a second set of RCIDs, each connected to the column read line.

13. The memory array device of claim 10, further the first set and the second set of RCIDs are configured to perform different functions during different modes of the memory unit cell.

14. The memory array device of claim 12, further comprising:
   a first random pulse generator connected to the row update line; and
   a second random pulse generator connected to the column update line.

15. The memory array device of claim 14, wherein the first random pulse generator and the second random pulse generator are configured to perform a stochastic update process for a backpropagation-based non-spiking neural network.

16. The memory array device of claim 10, wherein the given state update is comprised in a backpropagation-based non-spiking neural network that is configured to read and update synapse weights along axons and dendrites.

17. The memory array device of claim 10, wherein the adjusted pulse has an adjusted pulse width relative to the input pulse.

18. The memory array device of claim 10, wherein the memory element with hysteresis comprises an item selected from the group consisting of a ferroelectric memory device, a Complimentary Metal Oxide Semiconductor (CMOS) circuit, and a Resistive Processing Unit (RPU).

19. The memory array device of claim 10, further comprising an enable circuit for controlling the pulse adjustment circuit.

20. The memory array device of claim 10, wherein the enable circuit is configured to provide an enable signal to the pulse adjustment circuit of a given one of the plurality of memory unit cells response to a pulse state provided from a column input and another pulse state provided from a row input.

21. The memory array device of claim 10, wherein the memory unit cell is configured to selectively operate in a given mode selected from the group consisting of a read out mode and an update mode, and wherein the memory device comprises a vertical conductor line and a horizontal conductor line connected to each of the plurality of memory unit cells for the read out mode, and another vertical conductor line and another horizontal conductor line connected to each of the plurality of memory unit cells for the update mode.

22. The memory array device of claim 10, further the first set and the second set of RCIDs are configured to perform different functions during different modes of the memory unit cell.

23. The memory array device of claim 10, further comprising a set of read lines configured for reuse during update and array operations on the memory unit cell.

24. The memory array device of claim 10, wherein an output of memory array device is based on an integration operation that includes a number of positive pulses and a number of negative pulses applied to the memory array device during an integration window.

25. The memory array device of claim 10, wherein an input to the memory array device comprises a set of density modulated pulses, and an output from the memory array device comprises a set of integrated voltages.

* * * * *